US008317015B2

(12) United States Patent
Ji et al.

(10) Patent No.: US 8,317,015 B2
(45) Date of Patent: Nov. 27, 2012

(54) APPARATUS FOR LOCKING A MAGAZINE

(75) Inventors: Chang-Hwan Ji, Cheonan-si (KR);
Jong-Hoon Kim, Cheonan-si (KR);
Hee-Sang Yang, Cheonan-si (KR);
Jae-Nam Lee, Asan-si (KR); Jong-Chul Kim, Anan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 275 days.

(21) Appl. No.: 12/825,160

(22) Filed: Jun. 28, 2010

(65) Prior Publication Data
US 2011/0042242 A1    Feb. 24, 2011

(30) Foreign Application Priority Data

Aug. 20, 2009   (KR) .................................. 2009-77064

(51) Int. Cl.
*B65D 55/02*        (2006.01)
(52) U.S. Cl. ...... 206/1.5; 206/706; 206/711; 211/41.17; 211/41.18
(58) Field of Classification Search .................. 292/1, 3, 292/11, 22, 24, 25, 27, 44, 45, 49, 51, 95, 292/98, 194, 195, 197, 199, 280, 198, 201; 211/4, 41.42, 41.17, 41.18; 206/1.5, 710–712, 206/706, 707; 312/216–221
See application file for complete search history.

(56) References Cited

U.S. PATENT DOCUMENTS

| 5,317,482 | A  | * | 5/1994  | Bujtas ......................... 211/41.17 |
| 5,853,214 | A  | * | 12/1998 | Babbs et al. .................. 206/711 |
| 6,824,343 | B2 | * | 11/2004 | Kurita et al. .................. 414/217 |
| 7,086,540 | B2 | * | 8/2006  | Huang et al. ............... 211/41.18 |

FOREIGN PATENT DOCUMENTS

| JP | 08-119371   | 5/1996  |
| JP | 11-121603   | 4/1999  |
| JP | 2004-235536 | 8/2004  |
| JP | 2005-311093 | 11/2005 |

OTHER PUBLICATIONS

English Abstract for Publication No. 08-119371, Date of publication: May 14, 1996.
English Abstract for Publication No. 11-121603, Date of publication: Apr. 30, 1999.
English Abstract for Publication No. 2004-235536, Date of publication: Aug. 19, 2004.
English Abstract for Publication No. 2005-311093, Date of publication: Nov. 4, 2005.

* cited by examiner

*Primary Examiner* — Andrew Perreault
(74) *Attorney, Agent, or Firm* — F. Chau & Associates, LLC

(57) ABSTRACT

A locking apparatus for locking a magazine configured to receive a printed circuit board (PCB) may include an actuator, a rotating block, and a locking member. The actuator may be installed on the magazine. The rotating block may be connected to the actuator. The rotating block may be rotated about a vertical axis. The locking member may be rotatably connected to the magazine about the vertical axis. The locking member may be selectively combined with the rotating block to block a front face of the magazine, thereby preventing breakaway of the PCB from the magazine.

11 Claims, 5 Drawing Sheets

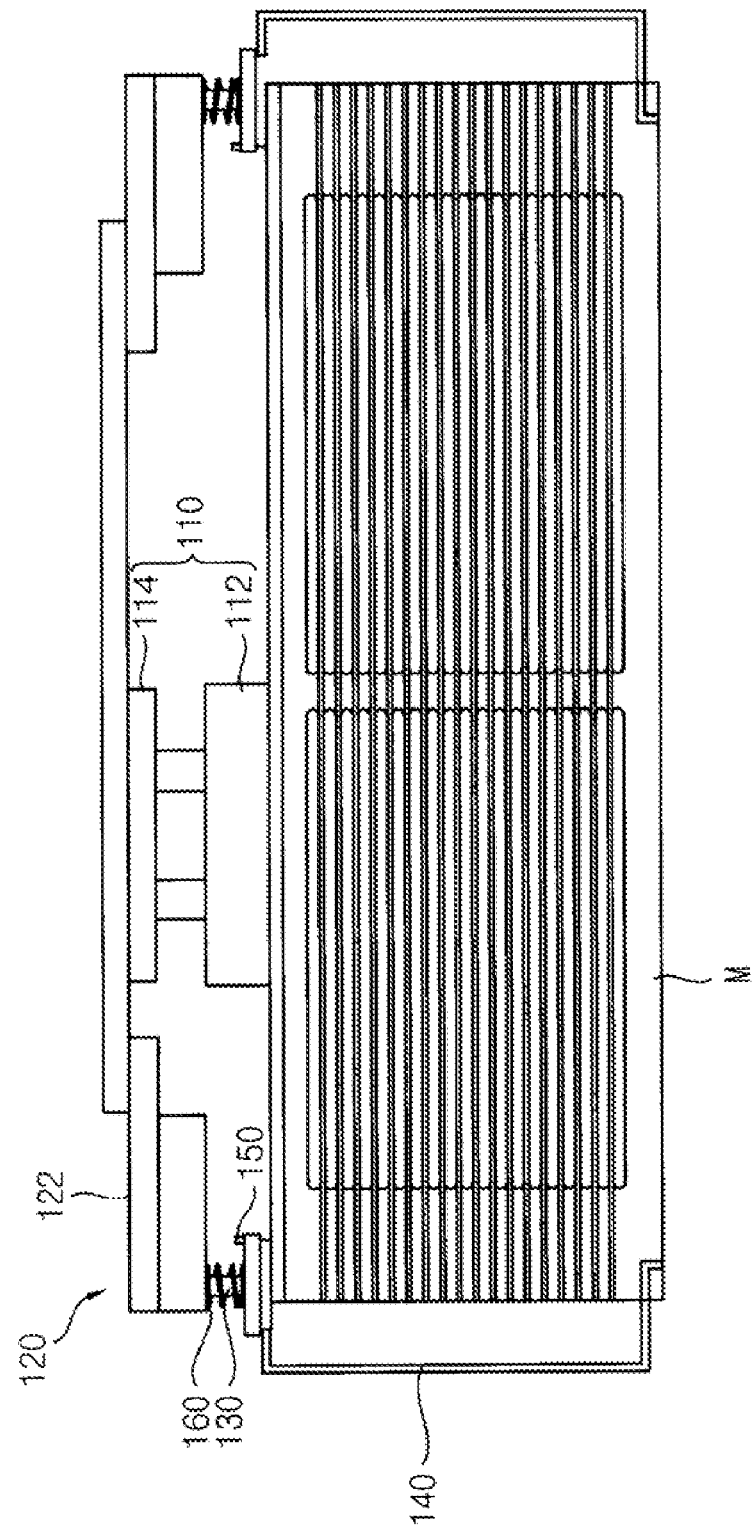

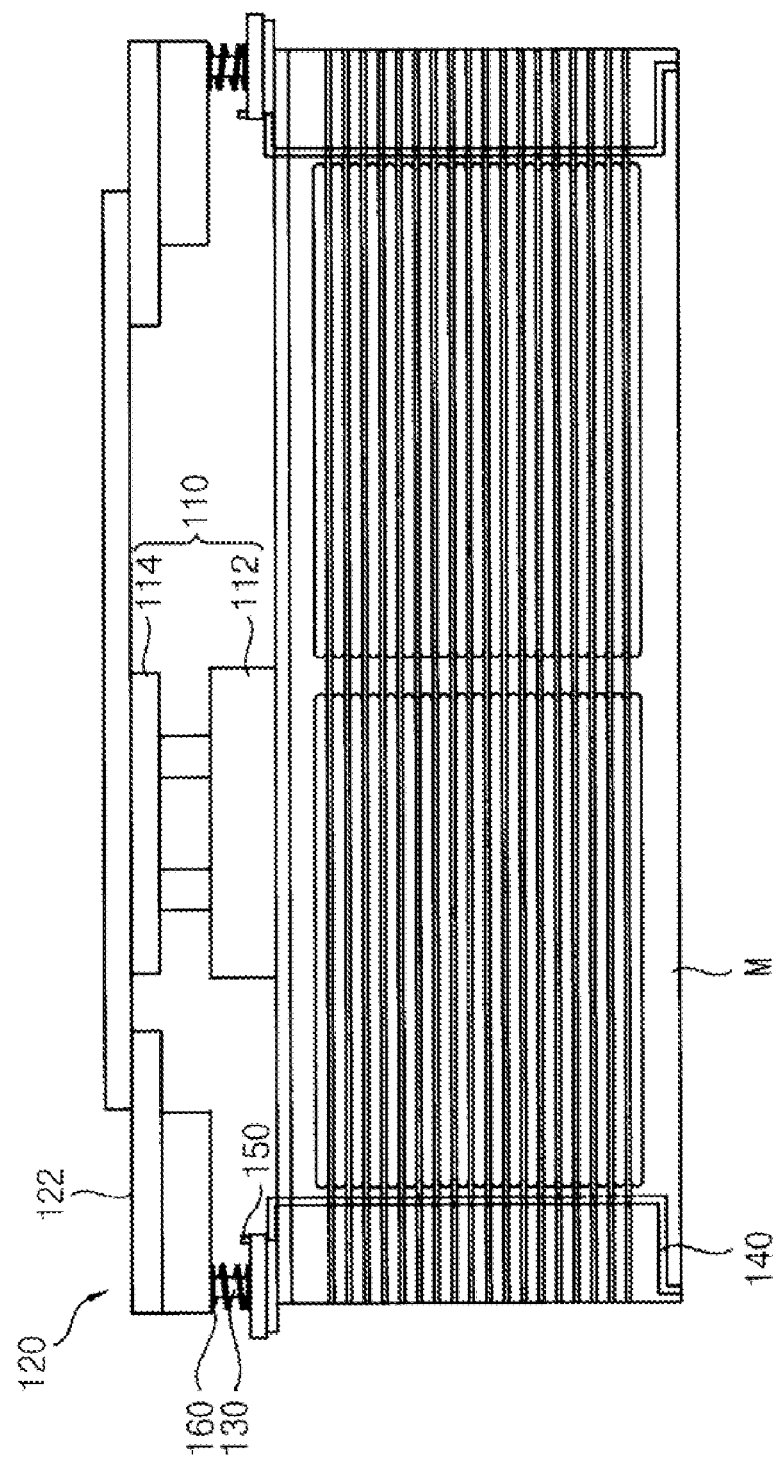

APPARATUS FOR LOCKING A MAGAZINE

CROSS-RELATED APPLICATION

This application claims priority under 35 USC §119 to Korean Patent Application No. 2009-77064, filed on Aug. 20, 2009 in the Korean Intellectual Property Office (KIPO), the contents of which are herein incorporated by reference in their entirety.

BACKGROUND

1. Field of the Invention

Exemplary embodiments of the invention are directed to an apparatus for locking a magazine. More particularly, exemplary embodiments of the invention are directed to an apparatus for preventing a printed circuit board (PCB) in a magazine from breaking away.

2. Description of the Related Art

In general, various kinds of semiconductor packages may be mounted on a printed circuit board (PCB). Thus, during manufacture, the PCBs may need to be transported to various unit processes. The PCBs may be transported using a magazine.

A conventional magazine may include a rectangular magazine body, a plurality of supporting members formed at inner surfaces of the magazine body to support the PCBs, and an apparatus for locking the PCBs to prevent breakaway of the PCBs from the supporting members while the magazine body is being transported.

The conventional locking apparatus may include a locking bar rotatably connected to the magazine body about a vertical axis. A worker may manually rotate the locking bar to lock the PCBs.

However, if a worker fails to rotate the locking bar due to carelessness while transporting the PCBs, the PCBs may fall off from the magazine, possibibly damaging the expensive PCBs.

In contrast, when unloading the PCBs from the magazine without releasing the locking bar, the PCBs may collide with the locking bar, also possibly damaging the expensive PCBs.

Further, if the magazine is impacted while waiting to be processed when the locking bar is unlocked, the PCBs may collide witht the locking bar.

SUMMARY OF THE INVENTION

Exemplary embodiments provide an apparatus for locking a magazine that may be capable of preventing damages of a PCB.

According to some exemplary embodiments, there is provided an apparatus for locking a magazine. The locking apparatus may include an actuator, a rotating block, and a locking member. The actuator may be installed on the magazine. The magazine is configured to receive a printed circuit board (PCB). The rotating block may be connected to the actuator. The rotating block may be rotated about a vertical axis. The locking member may be rotatably connected to the magazine about the vertical axis. The locking member may be selectively combined with the rotating block to block a front face of the magazine, thereby preventing breakaway of the PCB from the magazine.

In some exemplary embodiments, the actuator may include a rotating cylinder installed on the magazine, a rack connected to the rotating cylinder and linearly movable along a horizontal axis, and a pinion meshed with the rack and connected to the locking member to transmit a rotational movement about the vertical axis to the locking member from the linear movement of the rack.

In some exemplary embodiments, the rotating block may have a receiving groove configured to receive an upper end of the locking member.

In some exemplary embodiments, the locking apparatus may further include a sensor for sensing the presence of a PCB in the magazine, to control operations of the actuator.

In some exemplary embodiments, the locking apparatus may further include a lifting unit installed on the magazine to lift the actuator along the vertical axis.

In some exemplary embodiments, the lifting unit may include a lifting cylinder mounted on the magazine along the vertical axis, and a lifting block between the lifting cylinder and the actuator.

In some exemplary embodiments, the lifting block may have one or more adjusting grooves, each configured to receive an adjusting screw to adjust positions of the actuator.

In some exemplary embodiments, the locking apparatus may further include an absorbing spring installed around the locking block to absorb a contact impact between the magazine and the rotating block.

According to some exemplary embodiments, there is provided an apparatus for locking a magazine configured to receive a printed circuit board (PCB). The locking apparatus may include an actuator having a pair of rotating cylinders, a pair of rotating blocks, and a pair of locking members. The rotating cylinders may be arranged at both sides of the magazine along a horizontal axis. The rotating blocks may be connected to the rotating cylinders. The rotating blocks may be rotated about a vertical axis. The locking members may be rotatably connected to the magazine about the vertical axis. Each of the locking members may be selectively combined with one of the rotating blocks to block a front face of the magazine, thereby preventing breakaway of the PCB from the magazine.

In some exemplary embodiments, the locking apparatus may further include a lifting unit installed on the magazine and connected to the actuator. The lifting unit may lift the actuator along the vertical axis In some exemplary embodiments, the locking apparatus may further include a pair of sensors. Each sensor is attached to one of the rotating blocks. The sensors may detect the presence of a PCB in the magazine.

In some exemplary embodiments, the locking apparatus may further include a pair of absorbing springs. Each absorbing spring is disposed around one of the rotating blocks to absorb a contact impact between the magazine and the rotating block.

According to some exemplary embodiments, there is provided an apparatus for locking a magazine, the magazine being adapted for receiving a plurality of substrates. The apparatus may include a locking member, a rotating block, and a sensor. The locking member is rotatably connected to the magazine with respect to a vertical axis. The rotating block is rotatable about a vertical axis and has a receiving groove configured to receive an upper end of the locking member. The sensor is attached to the rotating block to detect a substrate in the magazine. The locking member may selectively block the front face of the magazine in response to a detection signal of the sensor. Thus, the PCB may be prevented from breaking away and colliding with the locking member.

In some exemplary embodiments, the locking apparatus includes an actuator connected to the rotating block, and a lifting unit installed on the magazine to lift the actuator along the vertical axis.

BRIEF DESCRIPTION OF THE DRAWINGS

FIGS. 6 and 7 are front views illustrating locking operations of the locking apparatus in FIG. 1.

DETAILED DESCRIPTION OF EXEMPLARY EMBODIMENTS

Figure 1:
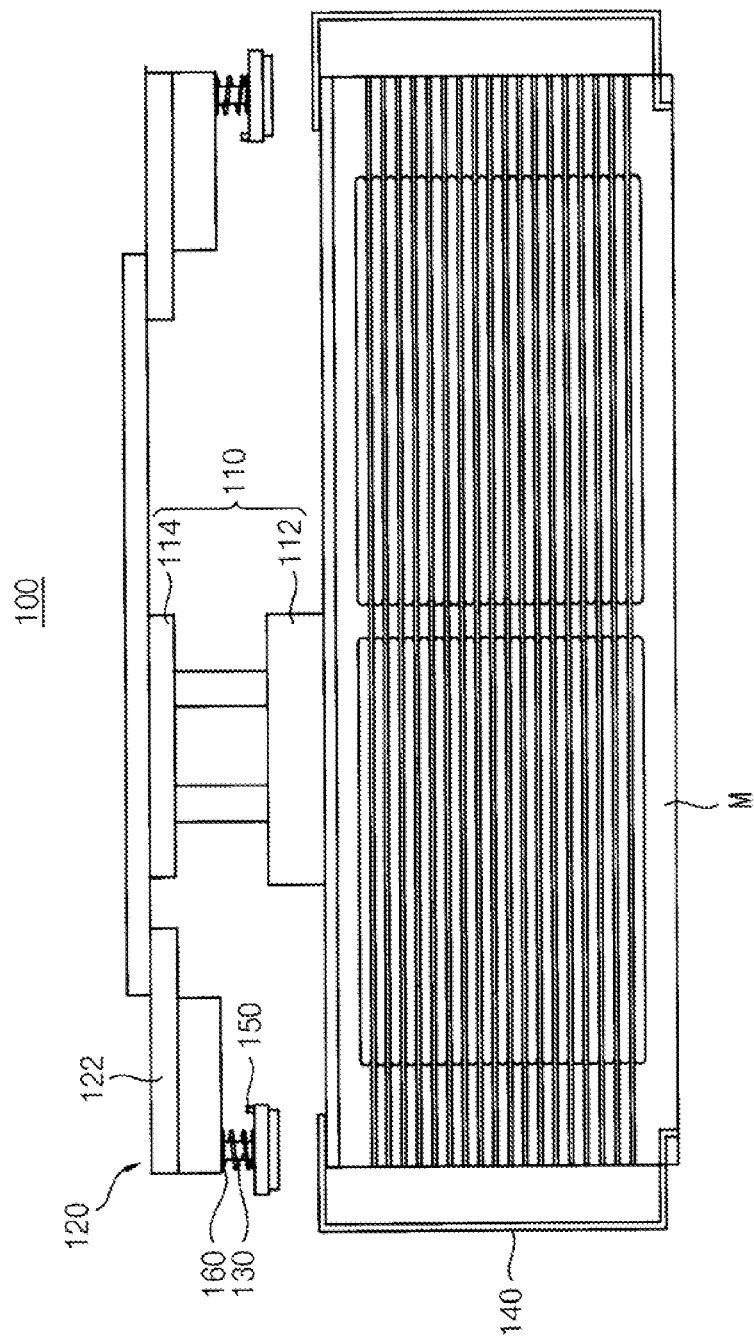
FIG. 1 is a front view illustrating an apparatus for locking a magazine in accordance with an exemplary embodiment of the invention.

Various exemplary embodiments will be described more fully hereinafter with reference to the accompanying drawings, in which some exemplary embodiments are shown. The present invention may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout.

Hereinafter, exemplary embodiments will be explained in detail with reference to the accompanying drawings.

Figure 2:
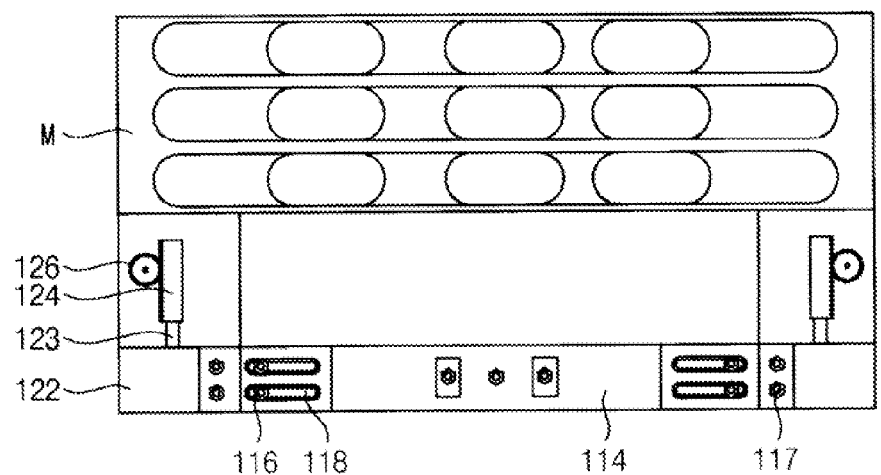
FIG. 2 is a plan view illustrating the locking apparatus in FIG. 1.
Figure 3:
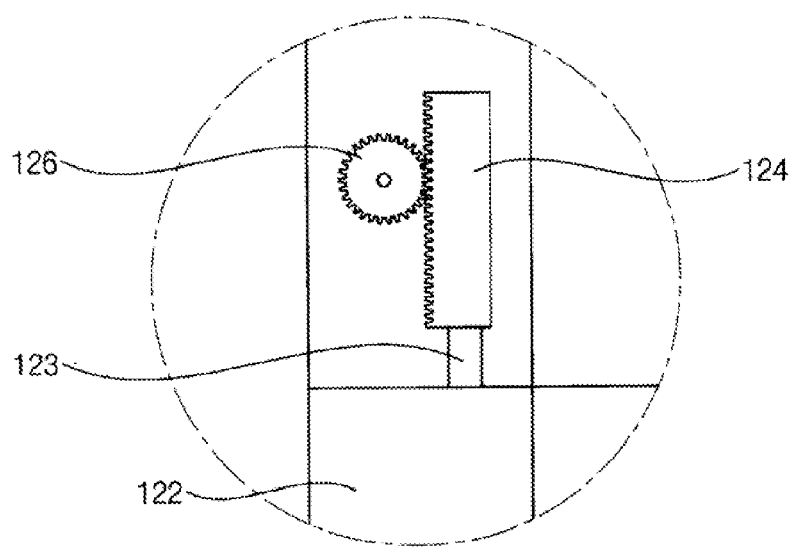
FIG. 3 is a plan view illustrating a left actuator of the locking apparatus in FIG. 1.
Figure 4:
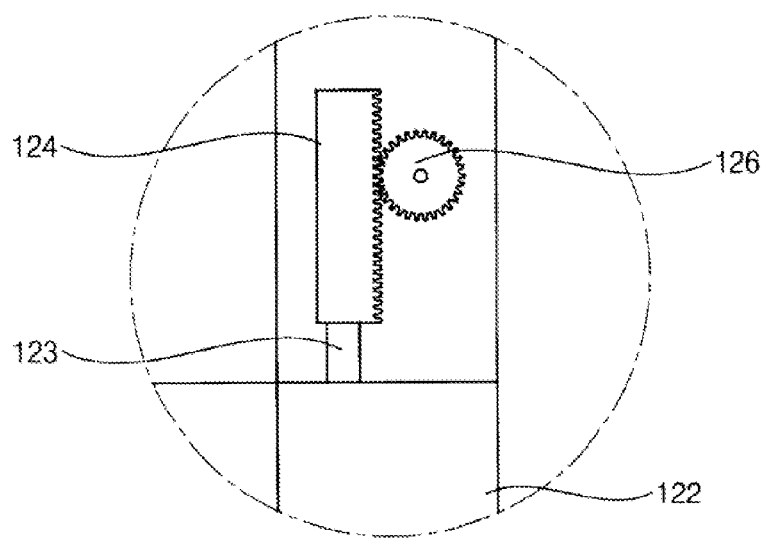
FIG. 4 is a plan view illustrating a right actuator of the locking apparatus in FIG. 1.
Figure 5:
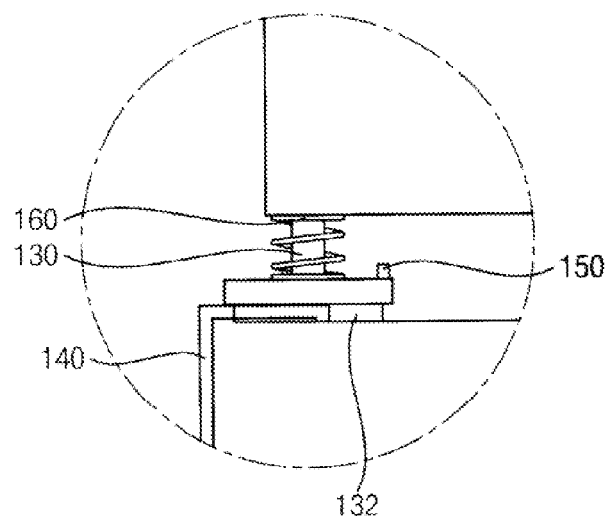
FIG. 5 is a cross-sectional view illustrating a rotating block and a locking member of the locking apparatus in FIG. 1.

FIG. 1 is a front view illustrating an apparatus for locking a magazine in accordance with an exemplary embodiment of the invention, FIG. 2 is a plan view illustrating the locking apparatus in FIG. 1, FIG. 3 is a plan view illustrating a left actuator of the locking apparatus in FIG. 1, FIG. 4 is a plan view illustrating a right actuator of the locking apparatus in FIG. 1, FIG. 5 is a cross-sectional view illustrating a rotating block and a locking member of the locking apparatus in FIG. 1, and FIGS. 6 and 7 are front views illustrating locking operations of the locking apparatus in FIG. 1.

Referring to FIGS. 1 and 2, a locking apparatus 100 of this exemplary embodiment may include a lifting unit 110, a pair of actuators 120, a rotating block 130 and a locking member 140.

The lifting unit 110 may be mounted on an upper central surface of a magazine M. In some exemplary embodiments, the magazine M may be configured to receive a plurality of substrates such as PCBs. A plurality of supporting members may be horizontally formed on both inner surfaces of the magazine M. Thus, the substrates may be horizontally inserted into between the supporting members.

In some exemplary embodiments, the lifting unit 110 may include a lifting cylinder 112 and a lifting block 114. The lifting cylinder 112 may be installed on the upper central surface of the magazine M along a vertical axis. The lifting block 114 may be connected to the lifting cylinder 112. Thus, the lifting cylinder 112 may lift the lifting block 114. The lifting block 114 may extend to both ends of the magazine M along the horizontal direction.

First adjusting grooves 116 may be formed on the lifting block 114 along a first horizontal direction. Second adjusting grooves 117 may be formed on the lifting block 114 along a second horizontal direction substantially perpendicular to the first horizontal direction. Adjusting screws 118 may be threadedly inserted into the first adjusting grooves 116 and the second adjusting grooves 117 to connect the lifting block 114 with the actuator 120. Thus, positions of the actuators 120 along the first horizontal direction and the second horizontal direction may be adjusted to the sizes of the magazine M by the insert positions of the adjusting screws 118.

The actuators 120 may be connected to the lifting block 114 via the adjusting screws 118. The actuators 120 may include a left driving unit (not shown) and a right driving unit (not shown). The left driving unit may have a structure substantially the same as that of the right driving unit.

Referring to FIGS. 3 and 4, each of the actuators 120 may include a rotating cylinder 122, a rack 124 and a pinion 126.

The rotating cylinder 122 may be fixed to the lifting block 114 via the adjusting screws 118. The rotating cylinder 122 may be arranged along the horizontal axis of the actuators 120. The rotating cylinder 122 may have a rod 123 extending toward an outside of the magazine M.

The rack 124 may be connected to the rod 123 of the rotating cylinder 122. The rack 124 may move linearly along the horizontal direction. The pinion 126 may mesh with the rack 124. Thus, linear movement of the rack 124 may be converted into a rotational movement of the pinion 126 about the vertical axis.

The rotating block 130 may be connected to the pinion 126. Therefore, the rotating block 130 may rotate together with the pinion 126 about the vertical axis. In some exemplary embodiments, the rotating block 130 may have a long cylindrical shape.

Referring to FIG. 5, the rotating block 130 may have a receiving groove 132 configured to receive an upper end of the locking member 140. In some exemplary embodiments, the receiving groove 132 may be formed at a lower surface of the rotating block 130. Because the upper end of the locking member 140 may have a long bar shape, the receiving groove 132 may also have a shape corresponding to the long bar shape. That is, the shape of the receive groove 132 may vary in accordance with the shape of the upper end of the locking member 140.

Referring again to FIGS. 1 and 2, the locking member 140 may be rotatably connected to both sides of the magazine M. The locking member 140 may be selectively inserted into the receiving groove 132 of the rotating block 130. Thus, the locking member 140 may rotate together with the rotating block 130 to selectively block a front face of the magazine M through which the substrates may otherwise be loaded and unloaded.

A sensor 150 may be attached to the rotating block 130. The sensor 150 may detect a substrate to control operations of the lifting unit 110 and the actuator 120. Alternatively, the sensor 150 may be attached to the magazine M.

In addition, when the rotating block 130 descends to be combined with the locking member 140, the rotating block 130 may make contact with the upper surface of the magazine M. To buffer a contact impact between the rotating block 130 and the magazine M, an absorbing spring 160 may be installed around the rotating block 130.

Here, the locking apparatus 100 of this exemplary embodiment may include the lifting unit 110. However, when the rotating block 130 is permanently fixed to the locking member 140, the above-mentioned structure is not needed to affect the locking operations of the locking apparatus 100. Thus, the locking apparatus 100 may exclude the lifting unit 110.

Hereinafter, the locking operations of the locking apparatus 100 may be illustrated in detail with reference to FIGS. 1, 6 and 7.

Referring to FIG. 1, when the magazine M is empty, the locking member 140 may be rotated toward the outside of the magazine M, to open the front face of the magazine M. Further, the lifting unit 110 may lift the actuator 120. Thus, the rotating block 130 may be separated from the locking member 140.

Referring to FIG. 6, when substrates are loaded into the magazine M, the sensor 150 detects the substrates in the magazine M and transmits a detection signal to the lifting unit 110. The lifting unit 110 may lower the lifting block 114. The actuator 120 descends together with the lifting block 114. Thus, the rotating block 130 may be combined with the locking member 140. That is, the upper end of the locking member 140 may be received in the receiving groove 132 of the rotating block 130. Here, while the rotating block 130 makes contact with the upper surface of the magazine M, the absorbing spring 160 may absorb the contact impact between the rotating block 130 and the magazine M.

The rotating cylinder 122 may linearly move the rack 124 along the horizontal direction. The pinion 126 may rotate about the vertical axis, to rotate the rotating block 130. As a result, the locking member 140 combined with the rotating block 130 rotate together with the rotating block 130, so that the locking member 140 blocks the front face of the magazine M. Therefore, the substrates are prevented from being broken away from the magazine M.

In contrast, when the substrates are to be unloaded from the magazine M, the rotating cylinder 122 inversely rotates the rack 124, to inversely rotate the pinion 126. Thus, the rotating block 130 and the locking member 140 rotate toward the outside of the magazine M, to open the front face of the magazine M.

The lifting cylinder 112 lifts the lifting block 114 and the actuator 120, to release the locking member 140 from the receiving groove 132 of the rotating block 130.

According to these exemplary embodiments, the locking member may selectively block the front face of the magazine in accordance with a detection signal of the sensor. Thus, the PCBs are prevented from being broken away. Further, the PCBs are prevented from colliding with the locking member. As a result, the locking apparatus may contribute to an automatic distribution system.

The foregoing is illustrative of various exemplary embodiments and is not to be construed as limiting thereof to the specific exemplary embodiments disclosed. Although a few exemplary embodiments have been described, those skilled in the art will readily appreciate that many modifications are possible in the exemplary embodiments without materially departing from the novel teachings of the embodiments of the present invention. Accordingly, all such modifications are intended to be included within the scope of the embodiments of the present invention as defined in the appended claims.

What is claimed is:

1. An apparatus for locking a magazine, the apparatus comprising:
    an actuator installed on a magazine, said magazine being configured to receive a substrate;
    a rotating block connected to the actuator and rotatable about a vertical axis; and
    a locking member rotatably connected to the magazine with respect to the vertical axis, the locking member combinable with the rotating block to block a front face of the magazine, wherein the actuator comprises:
    a rotating cylinder;
    a rack connected to the rotating cylinder, the rack being linearly movable along a horizontal axis; and
    a pinion meshed with the rack and connected to the locking member to transmit a rotational movement about the vertical axis from the rotating cylinder to the locking member from linear movement of the rack.

2. The apparatus of claim 1, wherein the rotating block has a receiving groove configured to receive an upper end of the locking member.

3. The apparatus of claim 1, further comprising a sensor attached to the rotating block to detect a substrate in the magazine.

4. The apparatus of claim 1, further comprising a lifting unit installed on the magazine to lift the actuator along the vertical axis.

5. The apparatus of claim 4, wherein the lifting unit comprises:
    a lifting cylinder installed on the magazine along the vertical axis; and
    a lifting block between the lifting cylinder and the actuator.

6. The apparatus of claim 4, wherein the lifting block has one or more adjusting grooves, each configured to receive an adjusting screw for adjusting positions of the actuator.

7. The apparatus of claim 1, further comprising an absorbing spring provided around the rotating block to absorb a contact impact between the magazine and the rotating block.

8. An apparatus for locking a magazine, the apparatus comprising:
    an actuator having a pair of rotating cylinders arranged on both sides of a magazine along a first horizontal axis, said magazine adapted to receive a plurality of substrates;
    a pair of rotating blocks, each rotating block connected to one of the rotating cylinders and rotatable with respect to a vertical axis; and
    a pair of locking members rotatably connected to the magazine about the vertical axis, each one of locking member selectively combinable with one of the rotating blocks to block a front face of the magazine,
    wherein the actuator further includes a pair of racks, each rack connected to one of the pair of rotating cylinders, each rack being linearly movable along a second horizontal axis, and
    a pair of pinions, each pinion meshed with one of the pair of racks and connected to one of the pair of locking members to transmit a rotational movement about the vertical axis from one of the pair of rotating cylinders to one of the pair of locking members from linear movement of the meshed rack.

9. The apparatus of claim 8, further comprising a lifting unit installed on the magazine and connected to the actuator, said lifting unit adapted to lifting the actuator along the vertical axis.

10. The apparatus of claim 8, further comprising a pair of sensors each attached to one of the rotating blocks and adapted to detect the presence of a substrate in the magazine.

11. The apparatus of claim 8, further comprising a pair of absorbing springs, each absorbing spring disposed around one of the pair of rotating blocks to absorb a contact impact between the magazine and the rotating block.

* * * * *